United States Patent [19]

Cramer et al.

[11] 3,733,558

[45] May 15, 1973

[54] STABLE LOW CURRENT AMPLIFIER

[75] Inventors: Joseph F. Cramer, Coral Springs, Douglas W. Nickerson, North Miami Beach, both of Fla.

[73] Assignee: Motorola, Inc., Franklin Park, Ill.

[22] Filed: May 20, 1971

[21] Appl. No.: 145,264

[52] U.S. Cl. ........................330/17, 330/13, 330/19, 330/25, 330/30 D, 330/86

[51] Int. Cl. ................................................H03f 3/18

[58] Field of Search......................307/260, 261, 288, 307/315, 265; 330/13, 16, 17, 19, 25, 29, 30 D, 69, 86

[56] References Cited

UNITED STATES PATENTS 3,626,209 12/1971 Chandos..........................307/261 X 3,100,876 9/1963 Schulz..................................330/17

3,610,952 10/1971 Chandos..........................307/261 X 3,467,910 9/1969 Schmidt................................330/29

*Primary Examiner*—Roy Lake

*Assistant Examiner*—Lawrence J. Dahl

*Attorney*—Mueller & Aichele

[57] ABSTRACT

Limiter amplifier adapted to be constructed in integrated circuit form and including a plurality of direct current coupled transistor stages capable of limiting operation from a one-cell battery. The amplifier has sufficient gain to limit on noise so that a rectangular wave output signal is developed at the output. An integrating network responsive to the output signal provides a bias voltage which is coupled through complementary emitter followers, having current sharing therebetween, to the input circuit to control the bias applied to the semiconductor devices so that the duty cycle of the rectangular wave output signal is regulated to be preferably a 50 percent duty cycle.

19 Claims, 1 Drawing Figure

PATENTED MAY 15 1973 3,733,558
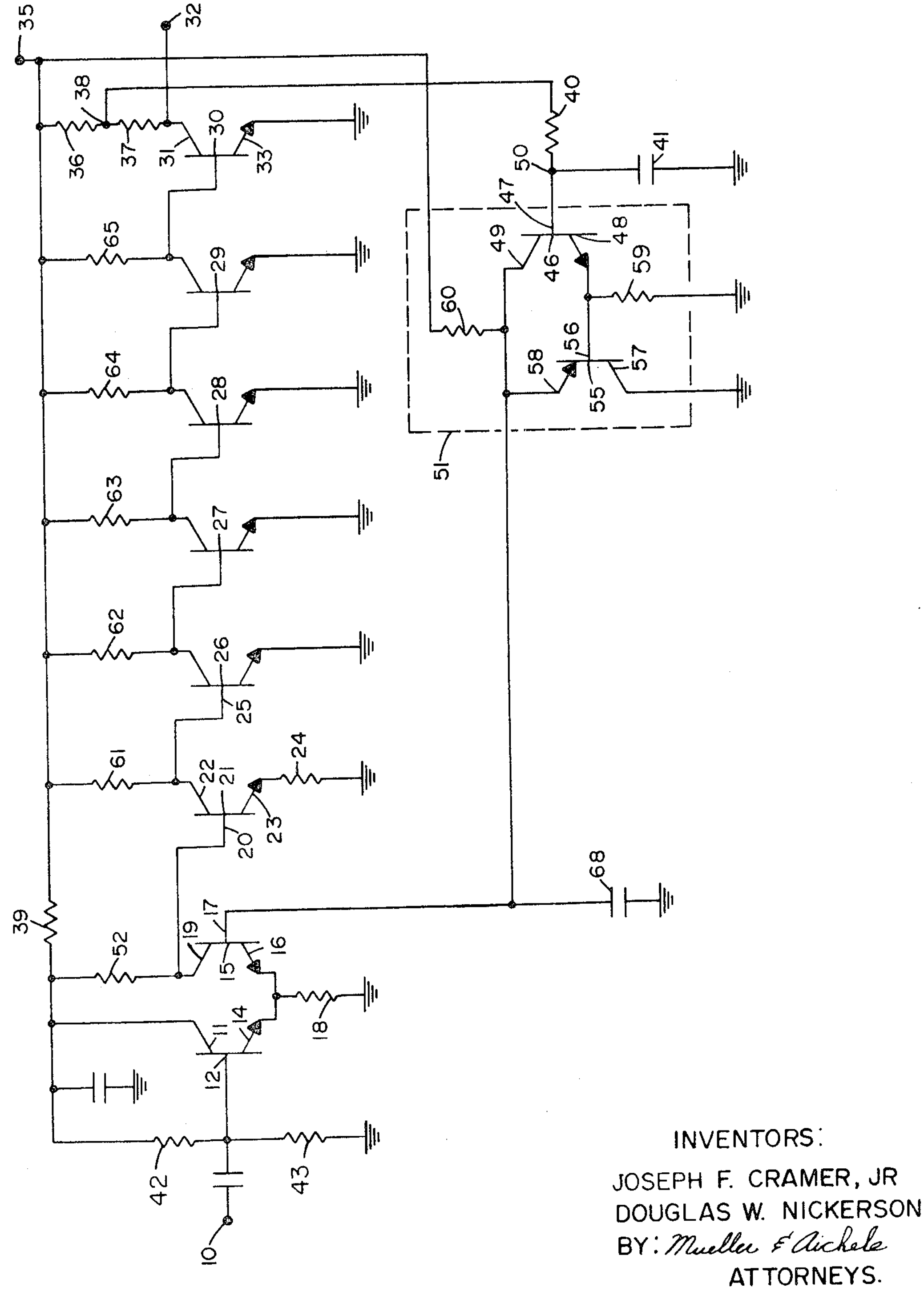
INVENTORS:
JOSEPH F. CRAMER, JR
DOUGLAS W. NICKERSON
BY: Mueller & Aichele
ATTORNEYS.

STABLE LOW CURRENT AMPLIFIER

BACKGROUND

In designing amplifiers which are to be manufactured in integrated circuit form, it is desirable to use direct current coupling as it is difficult to manufacture integrated circuits using internal capacitive coupling. However, the use of direct current coupling requires D.C. feedback to control the operating points. If any of the stages of an amplifier circuit limit, and in particular in amplifier limiters used in frequency modulation systems where the amplifier is designed to limit on noise, i.e. on random system energy without applied signal, where the output stage switches between saturation and non-conduction in response to the noises generated at the input stage of the amplifier, the D.C. feedback voltage to be applied to the input must be developed from the signal at the output. The D.C. feedback of such a limiter amplifier is adjusted to prevent any stage from permanently switching to either saturation or non-conduction and to provide an average 50 percent duty cycle output signal in response to a frequency modulated wave.

Problems are encountered in attempting to design limiter amplifiers and stabilization circuits which have a low power characteristic and are capable of operating from a minimum supply voltage such as a one-cell battery. One-cell batteries normally provide a nominal operating voltage of 1.2 volts. D.C. feedback or stabilization techniques heretofore employed to maintain a 50 percent duty cycle will not permit the amplifier limiter to be operated at a 1.2 volt nominal voltage, nor will they maintain a 50 percent duty cycle.

One-cell batteries are capable of varying over a voltage range of 1.5 volts to 0.9 volts. If an amplifier is to be manufactured for use with a one-cell battery, the D.C. feedback or stabilization techniques employed should be capable of operating the limiter amplifier and maintaining the 50 percent duty cycle over this voltage range. Stabilization circuits customarily employed are coupled between the output and input of the limiter amplifier to couple a bias voltage to the input which varies in accordance with the output signal duty cycle. The bias voltage is used to bias the input stage of the amplifier to maintain a 50 percent duty cycle. However, where a one-cell battery is employed wherein the operating voltage varies over the above stated range, the bias voltage variation over this range does not maintain the proper voltage necessary at the input stage to provide a 50 percent average duty cycle.

As previously stated, limiter amplifiers, and particularly those used in frequency modulation systems, have a substantial voltage gain between the input and output. Sufficient A.C. isolation between the input and output must be provided in order to prevent regeneration or amplifier performance degradation. Stabilization circuits, previously employed generally cannot provide sufficient impedance transformation between output and input when the operating voltage is supplied by a one-cell battery which varies over the above stated voltage range, nor could they provide sufficient current amplification. Both substantial impedance transformation and current amplification are required by the stabilization circuit in order to allow use of circuit components which provide adequate A.C. isolation.

SUMMARY

Accordingly, it is an object of this invention to provide a limiter amplifier and an improved bias stabilization circuit for a limiter amplifier wherein the average duty cycle of the output signal is maintained substantially at 50 percent.

Another object of this invention is to provide a limiter amplifier and bias stabilization circuit capable of operation from a one-cell battery.

Yet another object of this invention is to provide a limiter amplifier and bias stabilization circuit wherein the duty cycle of the output signal is maintained at 50 percent over the entire operating voltage range of a one-cell battery.

Still another object is to provide a limiter amplifier and a bias stabilization circuit, requiring a low power consumption.

A further object is to provide a bias stabilization circuit having a high impedance transformation and current amplification over the entire operating voltage of a one-cell battery.

In one form, a limiter amplifier for a frequency modulated receiver, has a number of semiconductor stages direct current coupled together in a cascade configuration. The gain of the amplifier is great enough to cause the output stage to be driven between non-conduction and saturation by the noise of the input stage, thereby producing a rectangular wave output signal at the output stage. It is desirable to stabilize this rectangular wave output signal to insure that no stages are permanently switched to saturation or non-conduction and to adjust the rectangular wave output to a 50 percent average duty cycle to allow proper operation of the detector coupled thereto. To provide this stabilization, an integration circuit is coupled to the output stage of the limiter amplifier and is responsive to the rectangular wave produced thereby to develop a bias signal which varies in accordance with the average duty cycle of the rectangular wave output signal. The bias voltage is coupled through a feedback circuit to the input stage of the limiter amplifier to control the bias thereat. By controlling the bias of the input stage the average duty cycle of the limiter amplifier can be maintained at a substantially 50 percent duty cycle.

The feedback circuit includes first and second silicon transistors arranged as complementary emitter followers, with current sharing between the emitter followers. Use of the complementary emitter followers in the feedback circuit allows the limiter amplifier and feedback circuit to be operated from a one-cell battery while providing substantial impedance transformation and current amplification through the feedback circuit. This allows use of circuit component values which prevent regeneration or degradation in the amplifier. Current sharing between the emitter followers causes the feedback circuit to compensate for the differences between the bias voltage variation and the voltage necessary at the input stage to maintain a 50 percent duty cycle over the operating voltage range of a one-cell battery.

THE DRAWING

The FIGURE is a schematic diagram of the limiter amplifier with the stabilization circuit of the invention.

DETAILED DESCRIPTION

In the FIGURE there is shown an IF limiter amplifier suitable for use in a frequency modulation superheterodyne receiver. An IF signal is received at input 10 and coupled to base 12 of transistor 11. Transistor 11 is one-half of a differential amplifier formed by transistors 11 and 15. A fixed bias potential is coupled to base 12 of transistor 11 through decoupling resistors 39 and resistors 42 and 43 from a one-cell battery at terminal 35. Emitters 14 and 16 of transistors 11 and 15 respectively are coupled to one end of resistor 18, which determines the total current in the differential amplifier. The other end of resistor 18 is coupled to ground potential. A variable bias potential for the differential amplifier is coupled to base 17 of transistor 15 in order to maintain a 50 percent duty cycle for the output signal of the limiter amplifier.

The output signal of the differential amplifier is developed at collector 19 of transistor 15 and coupled to base 20 of transistor 21. The output signal developed at collector 22 of transistor 21 is coupled to base 25 of transistor 26, and this is repeated through transistors 27, 28, 29 and 30. In the limiter amplifier as shown, sufficient gain is provided so that the amplifier will limit on noise. That is, the noise of the first amplifier stage, the differential amplifier including transistors 11 and 15, is amplified so that transistor 30 switches between saturation and non-conduction to develop a rectangular shaped A.C. output signal at collector 31 of transistor 30. The A.C. output signal appearing at collector 31 of transistor 30 is coupled to output 32 of the limiter amplifier. From output 32, the signal is coupled to the following stages of the receiver.

Operating voltage for the limiter amplifier is coupled from the one-cell battery at terminal 35 through resistors 36 and 37 to collector 31 of transistor 30. Transistor 30, in switching between saturation and non-conduction to develop the A.C. output signal, causes the voltage at junction 38, between resistors 36 and 37 to vary. The variation in voltage at junction 38 is coupled to an integration network consisting of resistor 40 and capacitor 41 to develop an integration or bias voltage which varies in accordance with the duty cycle of the A.C. output signal. The bias signal is coupled through feedback circuit 51, to be further described, to base 17 of transistor 15 to stabilize the duty cycle of the limiter amplifier. The magnitude of the bias signal at point 50 is established by the voltage divider consisting of resistors 36 and 37, the voltage drop from collector to emitter of transistor 30, the time constants of the integration network, and must correspond to the bias potential required at base 17 of transistor 15 in order to properly bias the differential amplifier consisting of transistors 11 and 15 to maintain the output signal at substantially a 50 percent average duty cycle. For example, assume that the voltage drop $V_{BE}$ from base 17 to emitter 16 of transistor 15 is approximately 0.7 volts for a silicon transistor. The required voltage on the base 17 of transistor 15 in order to forward bias transistor 15 would be the $V_{BE}$ drop, plus the voltage drop across resistor 18. The required voltage on base 17 must be a minimum of 0.75 volts for proper circuit operation. With the operating voltage applied to the limiter amplifier at terminal 35 at a voltage of 1.2 volts, the voltage at collector 31 of transistor 30 will be approximately supply voltage divided by two, due to the 50 percent duty cycle. This will be approximately 0.6 volts. The resistive divider consisting of resistors 36 and 37 is selected such that the voltage at junction 50 exceeds 0.75 volts with a 50 percent average duty cycle at collector 31, even when the supply voltage is reduced to 0.9 volts. In the circuit shown, the voltage at junction 50 is selected to be 5/6 of the nominal operating voltage with a nominal voltage of 1.2 volts applied at terminal 35.

In the preferred embodiment, the voltage at base 17 of transistor 15 is approximately 0.99 volts, as is the voltage at base 12 of transistor 11. The voltage at collector 19 is approximately 0.75 volts. The collector of an NPN transistor is normally biased at a D.C. level which is higher than the base voltage. The D.C. collector voltage is the quiescent value about which the A.C. output signal of the differential amplifier will vary. If collector 19 of transistor 15 were biased at a voltage above base 17, as for example 1.2 volts, a small positive A.C. voltage excursion would produce a cutoff condition in transistor 15, because the total D.C. voltage available cannot exceed the operating voltage.

If the average duty cycle is to be maintained at 50 percent, the first stage to limit must be in a conductive mode and a non-conductive mode for equal amounts of time. For a 50 percent average duty cycle, the first stage to limit must be conductive on the average 50 percent of the time and non-conductive on the average 50 percent of the time. The D.C. voltage at collector 19 must therefor be adjusted to allow the A.C. signal thereat to vary in a fashion which allows the first stage to limit to be conductive and non-conductive for equal periods of time.

In order to allow for a sufficient positive A.C. voltage excursion, the voltage at collector 19 is fixed at approximately 0.75 volts. Although this voltage is lower than the base voltage, it will still allow operation of transistor 15 in its active or conducting region. The A.C. signal at collector 19 may now have a voltage excursion about the D.C. quiescent point of 0.45 volts in both the positive and negative directions before producing a cutoff or saturation condition in transistor 15. The quiescent voltage at collector 19 is established at the above noted 0.75 volts by the ratio of resistor 18 and the resistor 52 attached to collector 19 of transistor 15. The collectors of transistors 21, 26, 27, 28 and 29 are maintained at approximately 0.65 volts, and a low quiescent current flows through each stage when no signal or noise is applied to the amplifier. This is due to the base-emitter voltage drop of the following stage, clamping the voltage at the collector of the preceding stage at the above voltage. When signal or noise is applied, the stages, starting with stage 30 begin to switch between conduction and non-conduction. As the signal or noise level further increases, the earlier stages begin to switch between conduction and non-conduction, while the last stage will begin to switch between saturation and non-conduction. As a stage begins to switch between saturation and non-conduction, the voltage at the collector will begin to decrease. If a stage is switching between saturation and non-conduction, and is in each mode 50 percent of the time, the collector voltage will be reduced to 0.325 volts. This is 50 percent of the total possible voltage excursion of the stage. In the embodiment shown, the voltage at the collector of transistor 29 is approximately at 0.325 volts with signal or noise applied to the amplifier. The voltage at the collector of transistor 30 is approximately 0.60 volts, and the voltage at the collectors of transistors 28, 27, 26 and 21 are approximately 0.65 volts. As the signal level to the amplifier increases, stages 28, 27, 26 and 21 respectively begin to switch between saturation and non-conduction, causing the collector voltage of each stage to be reduced towards 0.325 volts. As the collector voltage of each stage is directly coupled to the following transistor base, it acts to provide a correct forward bias at the base of the following stage. This allows each stage to be operated from a minimum supply source of 0.9 volts. By operating each stage at this low collector and base voltage, and by correctly choosing collector load resistors 61, 62, 63, 64 and 65, the current drain, and therefore the power consumption, is substantially reduced, while still providing a limiter amplifier with substantially a 50 percent duty cycle.

The feedback circuit is an amplifier consisting of transistors 46 and 55 which are arranged as complementary emitter followers. Silicon transistors are preferred as they are easily adaptable to integrated circuits. Each emitter follower has a high input to output impedance and a high current gain characteristic. Complementary emitter followers will therefore provide a substantial impedance transformation and current gain between base 47 of transistor 46 and emitter 58 of transistor 55. That is, at junction 50, the impedance of feedback circuit 51 as seen by the integrator is very high, whereas the impedance of feedback circuit 51, as seen by capacitor 68 is quite low. This allows the component values of resistor 40, capacitor 41 and capacitor 68 to be selected such that a maximum A.C. attenuation over the desired frequency range can be provided between junction 38 and base 17 of transistor 15. The configuration of feedback circuit 51 also causes this substantial impedance transformation to remain relatively constant over the entire operating voltage range of a one-cell battery so that the desired A.C. attenuation can be provided over this voltage range. Furthermore, in the event of a sudden shift in D.C. levels of the amplifier, the high current gain of feedback circuit 51, resulting from the complementary emitter follower configuration, allows rapid charging of capacitor 68 to quickly develop the desired D.C. potential at base 17 of transistor 15 while requiring low amounts of current from the integrator.

Collector 49 of transistor 46 and emitter 58 of transistor 55 are coupled together at one end of resistor 60. The other end of resistor 60 is coupled to the operating voltage at terminal 35. Coupling collector 49 and emitter 58 directly together provides a current sharing path between transistor 46 and 55, resulting in operational features to be described in a subsequent portion of this application. Resistors 60 and 59 are selected such that they provide a total current which allows the desired current sharing between transistors 46 and 55. In the embodiment shown, resistor 60 is 2,000 ohms and resistor 59 is 6,500 ohms. Emitter 48 of transistor 46 is coupled to base 56 of transistor 55, and one end of resistor 59. Collector 57 of transistor 55 and the other end of resistor 59 are coupled to ground potential. The bias potential developed at junction 50 by the integration network consisting of resistor 40 and capacitor 41 is coupled to base 47 of transistor 46 causing transistor 46 to conduct. In order to cause transistor 46 to conduct, the voltage at base 47 must be high enough to forward bias transistor 46. That is, the voltage at base 47 must be higher than the base to emitter voltage drop, $V_{BE}$, of transistor 46. In the embodiment shown, the voltage at base 47 is approximately 0.75 volts, when the operating voltage is at the 0.9 volt minimum. With base 47 at 0.75 volts, emitter 48 will develop a voltage of approximately 0.05 volts which will be coupled to base 56 of transistor 55. As emitter 58 is coupled through resistor 60 to the one-cell battery, emitter 58 will be 0.7 volts higher in voltage than base 56, causing transistor 55 to conduct. With transistor 55 conducting, the voltage at emitter 58 will be 0.7 volts greater than at base 56, thereby reproducing the same bias at emitter 58 as was present at base 47 of transistor 46. The 0.7 volt drop due to transistor 46 is therefore offset by the 0.7 volt increase due to transistor 55, providing a bias potential at base 17 of transistor 15 which is substantially the same as the bias potential developed at junction 50 of the integration network. Furthermore, the voltage at collector 49 is maintained at the same voltage as emitter 58. This is at approximately 0.75 volt with a 0.9 volt supply, and at 0.99 volts with a 1.2 volt supply. With collector 49 held at this voltage level, feedback circuit 51 can also be operated from a one-cell battery.

As previously stated, emitter 48 of transistor 46 is coupled to base 56 of transistor 55, and collector 49 is connected to emitter 58. The base-emitter junction of transistor 55 is therefore connected directly between the collector and emitter of transistor 46. As the base-emitter voltage of a transistor has voltage limits when a transistor is conducting, the collector-emitter voltage of transistor 46 will be maintained at the $V_{BE}$ drop of transistor 55. This will prevent damage to transistor 46 due to sudden changes in applied voltage or input signal and also due to changes in ambient temperature.

Operation of the differential amplifier consisting of transistors 11 and 15 differs substantially from the operation of transistor 30 in that transistor 30 switches between saturation and non-conduction whereas the differential amplifier is operating in a linear manner. The mode of operation of each stage of the limiter amplifier is slightly different from any other. This variation in modes of operation between stages, and in particular between the differential amplifier and transistor 30, will cause a difference in the rate of change of bias potential at base 12 of transistor 11 and of the bias potential developed at junction 50 with variation in the operating voltage supplied by the one-cell battery. The bias potential applied to base 17 of transistor 15 in the differential amplifier must vary at the same rate, with changes in operating voltage, as the bias applied to base 12 of transistor 11. The bias potential available at base 17 is, however, developed at junction 50 of the integration network. The feedback circuit 51, consisting of transistors 46 and 55 must therefore be designed to offset this difference in rate of change in bias potential at transistor 11 and junction 50. By directly connecting collector 49 of transistor 46, and emitter 58 of transistor 55 together through a correctly selected common resistor 60, and selecting an appropriate value for resistor 61, the current sharing provided thereby causes the rate of change in bias potential between base 47 of transistor 46 and emitter 58 of transistor 55, to offset the difference in rate of change in bias potential between base 12 of transistor 11 and junction 50 over the voltage range of a one-cell battery.

In operation, assume that the rectangular output signal appearing on collector 31 of transistor 30 has a 50 percent duty cycle and resistors 37 and 36 have been chosen so as to allow junction 50 of the integration network to develop a proper bias potential. The bias control signal developed by the integrating network consisting of resistor 40 and capacitor 41 and coupled through feedback circuit 51 to base 17 of transistor 15 acts to properly maintain the bias level of the differential amplifier consisting of transistors 11 and 15, for a 50 percent duty cycle. If the duty cycle increases in the positive direction, the bias control signal developed at junction 50 and coupled to base 17 of the transistor 15 will increase. This increase in the bias signal applied to base 17 of transistor 15 will change the operation of the limiter amplifier so as to decrease the duty cycle of the output signal. If the duty cycle were to decrease, the bias control signal potential will also decrease and will act to bias transistor 15 so that the duty cycle will be increased. Thus, the integrating network and feedback circuit 51 acts to establish the proper bias voltage on base 17 of transistor 15 to maintain the desired duty cycle.

As can be seen, an improved bias stabilization circuit for a limiter amplifier has been provided which maintains the duty cycle of the amplifier at substantially 50 percent. The limiter amplifier and bias stabilization circuit are capable of operation from a one-cell battery. Use of complementary emitter followers in the feedback circuit provides substantial impedance transformation and current amplification between the limiter amplifier input and output thereby improving circuit operation and reliability. Use of current sharing between the complementary emitter followers of the feedback circuit allows operation of the limiter amplifier and bias stabilization circuit over the entire operating voltage range of a one-cell battery.

We claim:

1. Amplifier circuit means adapted to amplify an input signal, including in combination, a limiter amplifier having a plurality of semiconductor amplifier stages including an input stage, an output stage and a plurality of semiconductor amplifier stages therebetween, direct current coupling means interconnecting said stages in cascade, said limiter amplifier having sufficient gain that the noise of said input stage causes said output stage to be driven between non-conduction and saturation thereby producing a rectangular wave output signal at said output stage, integration means coupled to said output stage and responsive to the rectangular wave output signal produced thereby to develop a first bias signal, and feedback circuit means coupled to said integration means and said input stage, said feedback circuit means including first and second opposite conductivity transistors coupled together and having current sharing therebetween, said feedback circuit means being responsive to said first bias signal to develop a second bias signal and couple said second bias signal to said input stage, said input stage being responsive to said second bias signal to regulate the duty cycle of said rectangular wave output signal.

2. The amplifier circuit means of claim 1 wherein said input stage includes, first and second transistor means forming a differential amplifier and having emitter electrodes coupled together and base electrodes, said base electrode of said first transistor means being adapted to receive an input signal, said feedback circuit means being coupled to said base electrode of said second transistor means.

3. The amplifier circuit means of claim 1 wherein the first and second transistors of opposite conductivity type, have base, emitter and collector electrodes, the base electrode of said first transistor being coupled to said integration means, the emitter electrode of said second transistor being direct current coupled to said input stage, said first transistor collector electrode and second transistor emitter electrode being directly coupled together for providing current sharing therebetween, a first resistance means coupled between said first transistor collector electrode and a second potential, said first transistor emitter electrode being coupled to said second transistor base electrode and a second resistance means, said second transistor collector electrode and second resistance means being coupled to said first potential.

4. The amplifier circuit of claim 3 wherein said first transistor is a semiconductor of the NPN type, and said second transistor is a semiconductor of the PNP type.

5. The amplifier circuit means of claim 1 wherein said first and second transistors of opposite conductivity type form a sequence of complementary emitter followers, said first transistor collector electrode and said second transistor emitter electrode being connected together to provide current sharing therebetween.

6. The amplifier circuit of claim 5 wherein said first and second semiconductor transistors are silicon.

7. An amplifier circuit for amplifying an alternating current wave and operable over an operating voltage range of a one-cell battery, including in combination, an amplifier having a plurality of semiconductor stages, including an input and output stage, with direct current coupling means connecting said stages in cascade to form a direct current amplifier, said direct current amplifier having sufficient gain that said output stage is driven between saturation and non-conduction in response to the noise of said input stage, thereby producing a rectangular wave output signal at said output stage, said input stage including circuit means for receiving a first control signal to regulate the duty cycle of said rectangular wave output signal, said first control signal necessary to regulate the duty cycle varying at a first rate with variation of the operating voltage, an integrating network coupled to said output stage, said integrating network being responsive to said rectangular wave output signal to develop a second control signal which varies with the duty cycle of said rectangular wave output signal, said second control signal varying at a second rate with variation of the operating voltage, and feedback circuit means coupled to said integrating network and to said input stage, said feedback circuit means being operative in response to said second control signal to develop said first control signal, said feedback circuit means including circuit means operative to compensate for the difference between said first and second rates of variation so that the duty cycle of said output circuit is regular and held substantially constant over the operating voltage range.

8. The amplifier circuit of claim 7 wherein said feedback circuit means includes first and second opposite conductivity transistors coupled together and forming a sequence of complementary emitter followers, said first and second transistors having current sharing therebetween.

9. In an amplifier circuit for amplifying an alternating current wave and operating from a predetermined supply voltage and including a plurality of stages each having a transistor with base, emitter and collector electrodes with a voltage drop developed between the base and emitter electrodes, the combination including, direct current coupling means connecting said stages from an input stage through a plurality of intermediate stages to an output stage, said stages having sufficient gain that said output stage is driven between saturation and non-conduction in response to noise signals developed in said input stage, said output stage having an output terminal connected to said collector electrode of said transistor thereof providing a rectangular wave output signal having an average value which varies in accordance with the average duty cycle, and a second terminal providing a second signal having an average value greater than that of said output signal, said second signal varying in accordance with said duty cycle, an integrating network coupled to said second terminal and responsive to said second signal to provide a voltage which varies in accordance with the average duty cycle of said second signal, feedback circuit means coupling said integrating network to said base electrode of said transistor of said input stage for providing a direct current bias voltage thereto, said input stage including a first resistor connecting said emitter electrode of the transistor thereof to a reference potential and a second resistor connecting said collector electrode to the supply voltage, said input stage having a voltage drop between the base and emitter electrodes which is of the order of one-half the supply voltage, input means connected to said first resistor, the first intermediate stage including a third resistor connecting said emitter electrode of the transistor thereof to said reference potential and a fourth resistor connecting said collector electrode to the supply voltage, and a conductor directly connecting said collector electrode of said input stage to said base electrode of said first intermediate stage, said conductor having a voltage thereon less than the bias voltage applied to said base electrode of said input stage and greater than the voltage drop between said base and emitter electrodes of said first intermediate stage.

10. THe amplifier circuit of claim 9 wherein said input means includes, a transistor having base, collector and emitter electrodes, said emitter electrode being connected to said first resistor and said collector electrode being coupled to said supply voltage, bias means coupled to said base electrode for supplying a bias voltage thereto, and means coupled to said base electrode for coupling said alternating current wave thereto, said input means transistor and said input stage transistor forming a differential amplifier.

11. The amplifier of claim 10 wherein said input signal average value is substantially one half the supply voltage when the output signal average duty cycle is substantially 50 percent.

12. The amplifier circuit of claim 11 wherein said plurality of stages includes an input stage, an output stage, a first intermediate stage and a plurality of second intermediate stages direct current coupled together between said first intermediate stage and said output stage, conductor means directly connecting the emitter electrodes of the transistors in said output stage and in said second intermediate stages to said reference potential, and resistor means connecting the collector electrodes thereof to said supply voltage.

13. The amplifier circuit of claim 12 wherein said resistance means coupling said output stage transistor to said supply voltage includes first and second serially connected resistors, said second terminal being coupled to the junction of said first and second resistors.

14. In the amplifier circuit of claim 13, the feedback circuit means including an amplifier circuit having first and second supply terminals adapted to be connected across a source of supply voltage, a first transistor of one conductivity type having a collector, base and emitter, a second transistor of an opposite conductivity type to the conductivity type of said first transistor, said second transistor having a collector, base and emitter, means coupling the emitter of said first transistor with the base of said second transistor at a first junction, means coupling the collector of said first transistor with the emitter of said second transistor at a second junction, first circuit means coupling said first supply terminal with said first junction, second circuit means coupling said second supply terminal with said second junction, means coupling the collector of said second transistor with said first supply terminal, means for applying input signals to the base of said first transistor, and means for deriving output signals at the emitter of said second transistor.

15. The amplifier circuit of claim 14 wherein said first transistor is a semiconductor of the NPN type, and said second transistor is a semiconductor of the PNP type.

16. The amplifier of claim 15 wherein said first circuit means is a resistor and said second circuit means is a resistor.

17. An amplifier circuit including in combination, first and second supply terminals adapted to be connected across a source of supply voltage, a first transistor of one conductivity type having a collector, base and emitter, a second transistor of an opposite conductivity type to the conductivity type of said first transistor, said second transistor having a collector, base and emitter, means coupling the emitter of said first transistor with the base of said second transistor at a first junction, the collector of said first transistor being directly connected to the emitter of said second transistor at a second junction and having no intervening elements there between, first circuit means coupling said first supply terminal with said first junction, second circuit means coupling said second supply terminal with said second junction, means coupling the collector of said second transistor with said first supply terminal, means for applying input signals to the base of said first transistor, and means for deriving output signals at the emitter of said second transistor.

18. The amplifier circuit of claim 17 wherein said first transistor is a semiconductor of the NPN type, and said second transistor is a semiconductor of the PNP type.

19. The amplifier circuit of claim 18 wherein said supply voltage coupled to said first supply terminal is a reference potential, said first circuit means being a first resistor, and said second circuit means being a second resistor, said second resistor selected to provide current sharing between said first and second transistors.

* * * * *